US012777974B2

(12) United States Patent
Salato et al.

(10) Patent No.: US 12,777,974 B2
(45) Date of Patent: Oct. 27, 2026

(54) HIGH VOLTAGE INTEGRATED CIRCUIT PACKAGE WITH CORE

(71) Applicant: Allegro MicroSystems, LLC, Manchester, NH (US)

(72) Inventors: Maurizio Salato, Bedford, MA (US); Joseph Duigan, Peymeinade (FR); Andrew Bernard Keogh, Cork (IE); Andrew Thompson, Cheshire (GB); William P. Taylor, Amherst, NH (US); Vijay Mangtani, Nashua, NH (US)

(73) Assignee: Allegro MicroSystems, LLC, Manchester, NH (US)

(*) Notice: Subject to any disclaimer, the term of this patent is extended or adjusted under 35 U.S.C. 154(b) by 861 days.

(21) Appl. No.: 18/302,998

(22) Filed: Apr. 19, 2023

(65) Prior Publication Data

US 2024/0355797 A1 Oct. 24, 2024

(51) Int. Cl.
*H10W 90/00* (2026.01)
*H01F 27/02* (2006.01)
(Continued)

(52) U.S. Cl.
CPC .......... *H10W 90/00* (2026.01); *H01F 27/263* (2013.01); *H01F 27/266* (2013.01);
(Continued)

(58) Field of Classification Search
CPC ... H10W 90/00; H10W 74/01; H10W 74/111; H10W 90/811; H10W 70/40;
(Continued)

(56) References Cited

U.S. PATENT DOCUMENTS 3,858,138 A 12/1974 Gittleman et al.
4,461,966 A 7/1984 Hebenstreit
(Continued)

FOREIGN PATENT DOCUMENTS

DE 3700488 A1 7/1988
DE 10 2004 033 125 A1 2/2006
(Continued)

OTHER PUBLICATIONS

Response to U.S. Non-Final Office Action dated Sep. 26, 2025 for U.S. Appl. No. 18/338,479; Response Filed Feb. 2, 2026; 19 Pages.
(Continued)

*Primary Examiner* — Eliseo Ramos Feliciano
*Assistant Examiner* — Sophia W Kao
(74) *Attorney, Agent, or Firm* — DALY, CROWLEY, MOFFORD & DURKEE, LLP

(57) ABSTRACT

Systems, structures, circuits, and methods provide integrated circuit (IC) packages or modules having a transformer initially fabricated without a core. First and second semiconductor dies are disposed on a lead frame or other substrate. First and second coils are configured to about an aperture region. A hole or aperture may be formed in the IC package in the aperture region so a core may be placed and received in the aperture at a later time, e.g., such as after testing. The core may be a soft ferromagnetic material, e.g., metal, ferrite, and/or or a moldable material. In some examples, an insulating coating may be placed on the package to increase the isolation capability of the final package. The IC packages and modules may include various types of circuits; in some examples, IC packages or modules may include a galvanically isolated gate driver or other high voltage circuit.

20 Claims, 5 Drawing Sheets

(51) Int. Cl.

| | |
|---|---|
| ***H01F 27/26*** | (2006.01) |
| ***H01F 27/28*** | (2006.01) |
| ***H10W 74/01*** | (2026.01) |
| ***H10W 74/10*** | (2026.01) |

(52) U.S. Cl.

CPC .......... *H10W 74/01* (2026.01); *H10W 74/111* (2026.01); *H10W 90/811* (2026.01); *H01F 27/022* (2013.01); *H01F 27/2823* (2013.01)

(58) Field of Classification Search

CPC .. H10W 70/481; H01F 27/263; H01F 27/266; H01F 27/022; H01F 27/2823; H01F 27/24; H01F 27/2804; H01F 2019/085

See application file for complete search history.

(56) References Cited

U.S. PATENT DOCUMENTS

| | | | | |
|---|---|---|---|---|
| 4,748,351 | A | 5/1988 | Barzegar | |
| 4,970,420 | A | 11/1990 | Billings | |
| 5,019,719 | A | 5/1991 | King | |
| 5,051,609 | A | 9/1991 | Smith | |
| 5,430,613 | A | 7/1995 | Hastings et al. | |
| 5,598,135 | A | 1/1997 | Maeda et al. | |
| 5,847,631 | A | 12/1998 | Taylor et al. | |
| 5,926,003 | A | 7/1999 | Morita | |
| 5,959,846 | A | 9/1999 | Noguchi et al. | |
| 6,107,860 | A | 8/2000 | Vinciarelli | |
| 6,181,130 | B1 | 1/2001 | Hoshi et al. | |
| 6,281,560 | B1 | 8/2001 | Allen et al. | |
| 6,351,033 | B1 * | 2/2002 | Lotfi | H10W 70/421 257/532 |
| 6,377,155 | B1 | 4/2002 | Allen et al. | |
| 6,605,939 | B1 | 8/2003 | Jansseune et al. | |
| 6,775,901 | B1 | 8/2004 | Lee et al. | |
| 6,791,851 | B2 | 9/2004 | Brkovic | |
| 7,023,315 | B2 | 4/2006 | Yeo et al. | |
| 7,119,448 | B1 | 10/2006 | de Stasi | |
| 7,173,835 | B1 | 2/2007 | Yang | |
| 7,663,351 | B2 | 2/2010 | Korsunsky | |
| 7,719,112 | B2 | 5/2010 | Shen | |
| 7,804,697 | B2 | 9/2010 | Melanson | |
| 7,868,431 | B2 | 1/2011 | Feng et al. | |
| 8,063,689 | B2 | 11/2011 | Theiler | |
| 8,094,458 | B2 | 1/2012 | Furnival | |
| 8,217,748 | B2 | 7/2012 | Feng et al. | |
| 8,446,243 | B2 | 5/2013 | Strzalkowski et al. | |
| 8,680,837 | B2 | 3/2014 | Zeng et al. | |
| 8,736,343 | B2 | 5/2014 | Chen et al. | |
| 8,816,666 | B2 | 8/2014 | Kimura | |
| 9,048,020 | B2 | 6/2015 | Calvillo Cortes et al. | |
| 9,341,657 | B2 | 5/2016 | Klein | |
| 9,640,409 | B1 | 5/2017 | Yang et al. | |
| 9,660,584 | B2 | 5/2017 | Modi et al. | |
| 9,664,494 | B2 | 5/2017 | Fernandez et al. | |
| 9,743,523 | B2 | 8/2017 | Huang et al. | |
| 9,847,166 | B2 | 12/2017 | Kneller | |
| 9,887,034 | B2 | 2/2018 | Francis | |
| 9,899,140 | B2 | 2/2018 | Kneller et al. | |
| 9,922,764 | B2 | 3/2018 | Kneller et al. | |
| 9,948,294 | B2 | 4/2018 | Peter et al. | |
| 10,002,703 | B2 | 6/2018 | Wang et al. | |
| 10,014,798 | B1 | 7/2018 | Vinciarelli | |
| 10,062,495 | B2 | 8/2018 | Lloyd | |
| 10,145,908 | B2 | 12/2018 | David et al. | |
| 10,176,917 | B2 | 1/2019 | Parish et al. | |
| 10,217,558 | B2 | 2/2019 | Kneller | |
| 10,224,143 | B2 | 3/2019 | Kneller et al. | |
| 10,229,779 | B2 | 3/2019 | Harber | |
| 10,234,513 | B2 | 3/2019 | Vig et al. | |
| 10,256,027 | B2 | 4/2019 | Li et al. | |
| 10,319,509 | B2 | 6/2019 | Kneller et al. | |
| 10,347,413 | B2 | 7/2019 | Francis | |
| 10,495,699 | B2 | 12/2019 | Burdette et al. | |
| 10,573,457 | B2 | 2/2020 | Wang et al. | |
| 10,670,672 | B2 | 6/2020 | David et al. | |
| 10,811,181 | B2 | 10/2020 | Parish et al. | |
| 10,842,021 | B1 | 11/2020 | Song et al. | |
| 10,930,422 | B2 | 2/2021 | Francis | |
| 11,139,102 | B2 | 10/2021 | Kneller et al. | |
| 11,201,619 | B2 | 12/2021 | Rinne et al. | |
| 11,211,929 | B2 | 12/2021 | Rinne et al. | |
| 11,282,631 | B2 | 3/2022 | Francis | |
| 11,313,924 | B2 | 4/2022 | David et al. | |
| 12,170,165 | B1 * | 12/2024 | Vinciarelli | H01F 27/306 |
| 2005/0285262 | A1 | 12/2005 | Knapp et al. | |
| 2006/0022683 | A1 | 2/2006 | Johnson et al. | |
| 2008/0100395 | A1 | 5/2008 | Oikawa et al. | |
| 2009/0134964 | A1 | 5/2009 | Hebert et al. | |
| 2009/0147544 | A1 | 6/2009 | Melanson | |
| 2009/0237899 | A1 | 9/2009 | Furnival | |
| 2012/0008344 | A1 | 1/2012 | Zeng et al. | |
| 2012/0206171 | A1 | 8/2012 | Kimura | |
| 2013/0293268 | A1 | 11/2013 | Draxelmayr et al. | |
| 2016/0181004 | A1 | 6/2016 | Li et al. | |
| 2017/0232436 | A1 | 8/2017 | Bachman et al. | |
| 2017/0352473 | A1 | 12/2017 | Wang | |
| 2018/0072004 | A1 | 3/2018 | Roth et al. | |
| 2018/0254258 | A1 | 9/2018 | Ghannam | |
| 2018/0323133 | A1 | 11/2018 | Kirby | |
| 2020/0211939 | A1 * | 7/2020 | Khanolkar | H10W 70/40 |
| 2020/0211961 | A1 | 7/2020 | Khanolkar | |
| 2021/0043361 | A1 | 2/2021 | Osada | |
| 2021/0166860 | A1 | 6/2021 | Silva | |
| 2021/0256920 | A1 | 8/2021 | Bishop et al. | |
| 2021/0376822 | A1 * | 12/2021 | Thompson | H01F 27/266 |
| 2022/0116036 | A1 | 4/2022 | Rinne et al. | |
| 2022/0159839 | A1 | 5/2022 | Cho et al. | |
| 2022/0196763 | A1 | 6/2022 | David et al. | |
| 2022/0301762 | A1 | 9/2022 | Tsuchida et al. | |
| 2022/0399149 | A1 * | 12/2022 | Taparia | H01F 41/024 |
| 2023/0094556 | A1 | 3/2023 | Tuncer | |
| 2023/0216481 | A1 | 7/2023 | Sung | |
| 2023/0268826 | A1 * | 8/2023 | Yan | H02M 3/003 363/178 |

FOREIGN PATENT DOCUMENTS

| | | | |
|---|---|---|---|
| EP | 1 091 404 | A1 | 4/2001 |
| GB | 2 250 383 | A | 6/1992 |
| GB | 2 341 288 | A | 3/2000 |
| JP | H01300617 | A | 12/1989 |
| JP | 2001-167941 | | 6/2001 |
| JP | 2001 167941 | A | 6/2001 |
| JP | 2002-501678 | | 1/2002 |
| JP | 2003-234234 | | 8/2003 |
| JP | 2003 234234 | A | 8/2003 |
| JP | 2008-72021 | | 3/2008 |
| JP | 2008 072021 | A | 3/2008 |
| TW | M480151 | U | 6/2014 |
| WO | WO 93/21690 | | 10/1993 |
| WO | WO 95/12247 | | 5/1995 |
| WO | WO 98/56016 | | 12/1998 |
| WO | WO 2009/008739 | A1 | 1/2009 |
| WO | WO 2010/061281 | A2 | 6/2010 |
| WO | WO 2011/137845 | A1 | 11/2011 |
| WO | WO 2021/211920 | A1 | 10/2021 |

OTHER PUBLICATIONS

U.S. Non-Final Office Action dated Mar. 11, 2026 for U.S. Appl. No. 18/338,479; 20 Pages.

U.S. Notice of Allowance dated Apr. 9, 2026 for U.S. Appl. No. 18/350,049; 9 Pages.

Response to U.S. Final Office Action dated Dec. 1, 2025 for U.S. Appl. No. 18/350,049; Response Filed Jan. 26, 2026; 10 Pages.

Plotog et al., "PCBs with Different Core Materials Assembling in Vapor Phase Soldering Technology;" 2010 9$^{th}$ International Symposium on Electronics and Telecommunications; Nov. 11-12, 2010; 4 Pages.

Response to U.S. Non-Final Office Action dated Oct. 21, 2025 for U.S. Appl. No. 18/350,049; Response Filed Nov. 10, 2025; 22 Pages.

(56) References Cited

OTHER PUBLICATIONS

U.S. Final Office Action dated Dec. 1, 2025 for U.S. Appl. No. 18/350,049; 12 Pages.
Bourgeois, "An Isolated Gate 25 Drive For Power MOSFETs and IGBTs", STMicroelectronics Group, AN461/0194, 1999; 7 pages.
"ADuM4135 Data Sheet, Single-/Dual-Supply, High Voltage Isolated IGBT Gate Driver with Miller Clamp", Analog Devices Inc., Rev. E, 2015; 17 pages.
"Si827x", Datasheet Rev. 0.5, Silicon Laboratories Inc., 2016; 43 pages.
International Search Report and Written Opinion dated Jun. 26, 2024, for International Application No. PCT/US2024/016822; 14 pages.
Sefa et al., "A comparative study of nanocrystalline and SiFe core materials for medium-frequency transformers"; IEEE International Conference on Electronics, Computers and Artificial Intelligence (ECAI); Oct. 2014; 6 pages.
International Search Report and Written Opinion dated Jul. 30, 2024, for International Application No. PCT/US2024/024705; 20 pages.
U.S. Non-Final Office Action dated Sep. 26, 2025 for U.S. Appl. No. 18/338,479; 19 Pages.
U.S. Non-Final Office Action dated Oct. 21, 2025 for U.S. Appl. No. 18/350,049; 11 Pages.
U.S. Appl. No. 09/445,234, filed Dec. 2, 1999, Hundt.
U.S. Appl. No. 18/338,479, filed Jun. 21, 2023, Taylor.
U.S. Appl. No. 18/350,049, filed Jul. 11, 2023, Taylor.
Great Britain Examination Report under Section 18(3) dated Oct. 17, 2022, for Great Britain Patent Application No. GB2008310.1; 4 pages.
Response to United Kingdom Examination Report dated Oct. 17, 2022, for UK Patent Application No. 2008310.1; Response filed on Jan. 17, 2023; 11 pages.
Intention to Grant dated Mar. 15, 2023, for UK Patent Application No. GB2008310.1; 4 pages.
Great Britain Search and Examination Report dated Oct. 12, 2020, for Great Britain Patent Application No. GB2008310.1; 8 pages.

* cited by examiner

STEP 3

HIGH VOLTAGE INTEGRATED CIRCUIT PACKAGE WITH CORE

BACKGROUND

Solid state switches typically include a transistor structure and are usually either turned on completely or turned off completely. The controlling electrode of the switch, usually referred to as its gate (or base), is typically controlled (driven) by a switch drive circuit, sometimes also referred to as gate drive circuit. Such solid-state switches are typically voltage-controlled, turning on when the gate voltage exceeds a manufacturer-specific threshold voltage by a margin, and turning off when the gate voltage remains below the threshold voltage by a margin.

Switch drive circuits typically receive their control instructions from a controller such as a pulse-width-modulated (PWM) controller via one or more switch driver inputs. Switch drive circuits deliver their drive signals directly (or indirectly via networks of active and passive components) to the respective terminals of the switch (gate and source).

Some electronic systems, including ones with solid state switches, have employed galvanic isolation to prevent undesirable DC currents flowing from one side of an isolation barrier to the other. Such galvanic isolation can be used to separate circuits in order to protect users from coming into direct contact with hazardous voltages. Galvanic isolation may also be used to simplify circuit design, reduce cost or improve system performance.

Various transmission techniques are available for signals to be sent across galvanic isolation barriers including optical, capacitive, and magnetic coupling techniques. Magnetic coupling typically relies on use of a transformer to magnetically couple circuits on the different sides of the transformer, typically referred to as the primary and secondary sides, while also providing galvanic separation of the circuits.

Transformers used for magnetic-coupling isolation barriers typically utilize a magnetic core to provides a magnetic path to channel flux created by the currents flowing in the primary and secondary sides of the transformer. Magnetic-coupling isolation barriers have been shown to have various drawbacks, including manufacturing problems, for integrated circuit (IC) packages due to the included magnetic core.

SUMMARY

An aspect of the present disclosure includes a galvanically-isolated integrated circuit package. The galvanically-isolated integrated circuit package can include a substrate, e.g., a lead frame or PCB, configured to receive one or more (e.g., two) semiconductor dies; a molding material configured to cover a portion of the substrate (e.g., lead frame) and form a package body and having an aperture configured to receive a ferromagnetic core, e.g., a soft ferromagnetic core; and first and second coils in a transformer configuration and disposed in the package body, each including a plurality of windings disposed about the aperture; where, when the ferromagnetic core is received in the aperture, the first and second coils and ferromagnetic core are operable as a transformer configured to magnetically couple respective semiconductor dies received by the lead frame.

Implementations may include one or more of the following features. The galvanically-isolated integrated circuit package may include a ferromagnetic core configured to be received by the aperture of the package body. The galvanically-isolated integrated circuit package may include first and second semiconductor dies disposed on the substrate (lead frame), e.g., on respective die pads or die paddles. The first and/or second semiconductor dies may include an integrated circuit. The integrated circuit may include a gate driver circuit. The gate driver circuit may include a controller circuit. The aperture may include first and second apertures, and where the first and second coils are configured around the first and second apertures, respectively. The aperture may include an insulator having a bore (passageway or hole) from a first side of the package body to a second side of the package body, where the bore is configured to receive the ferromagnetic core. The ferromagnetic core may include multiple (e.g., first and second) core pieces and may have a desired shape, e.g., forming a closed shape such as a closed loop. The core can include a plurality of (e.g., first and second) core pieces configured for connection at one or more joints. A joint can include at least one extending member of a first core piece received by at least one extending member of a second core piece. The joint can include ferrite loaded epoxy disposed between portions of the first and second core pieces.

An aspect of the present disclosure can include a galvanically-isolated integrated circuit (IC) package or module. The galvanically-isolated integrated circuit package can include a substrate, e.g., a lead frame or printed circuit board (PCB), having first and second die-receiving structures/areas, e.g., die pads or die paddles; first and second semiconductor dies (a.k.a., IC dies) coupled to the first and second die pads, respectively; a molding material forming a package body and configured to cover a portion of the substrate (e.g., lead frame), where the package body includes an aperture configured to receive a ferromagnetic core; and first and second coils disposed in the package body, each including a plurality of windings disposed about the aperture; where, when the ferromagnetic core is received in the aperture, the first and seconds coils and ferromagnetic core are operable as a transformer configured to magnetically couple the first and second semiconductor dies.

Implementations may include one or more of the following features. The galvanically-isolated integrated circuit package may include a ferromagnetic core disposed in the aperture. The first and/or second semiconductor dies may include an integrated circuit. The galvanically-isolated integrated circuit package where the integrated circuit may include a gate driver circuit. The gate driver circuit may include a controller circuit. The ferromagnetic core may be a soft ferromagnetic material and may include a ferrite core. The aperture may include an insulator having a bore from a first side of the package body to a second side of the package body, where the bore is configured to receive the ferromagnetic core. Implementations of the described techniques may include hardware, a method or process, or computer software on a computer-accessible medium.

One general aspect can include a method of making a galvanically-isolated integrated circuit package having an aperture for a core, the method can include: providing a lead frame or other substrate (e.g., PCB, etc.) with first and second die-receiving areas/structures, e.g., die pads (paddles), holding first and second semiconductor dies, respectively; covering a portion of the substrate (e.g., lead frame) with a molding material; providing first and second coils in a transformer configuration and disposed in the package body, each including a plurality of windings disposed about the aperture; and forming a package body having an aperture configured to receive a ferromagnetic core, wherein when received in the aperture, the ferromagnetic core is operable with the first and second coils as a transformer configured to magnetically couple the first and second semiconductor dies. In some examples/embodiments, the core can be inserted into or received by the aperture after one or more molding steps for the package or package body. In some examples/embodiments, the core can be removable from the package body.

Implementations may include one or more of the following features. For the method, the lead frame (or other substrate) can include first and second die pads, respectively, and may include coupling first and second semiconductor dies to the first and second die pads, respectively. The first and second semiconductor dies may include first and second integrated circuits. The first and/or second integrated circuits may include a gate driver circuit or circuitry. The method may include applying a diagnostic signal to the first and/or second integrated circuit. The method may include applying a diagnostic signal to the lead frame. The ferromagnetic core may include a ferrite core. The aperture may include an insulator having a bore from a first side of the package body to a second side of the package body, where the bore is configured to receive the ferromagnetic core. The aperture may include first and second apertures. The first and second coils may be configured around the first and second apertures, respectively. The ferromagnetic core may be formed in the first and second apertures by inserting a first core part into the first and second apertures and coupling a second core part to the first core part, forming a core configured as a closed loop or loops. The core parts may be connected with a bonding material, e.g., ferrite loaded epoxy, etc., to lower reluctance at the joint or connection of/between the ferrite core parts. The core may be mounted with or bonded to other parts/structure of a package by a bonding material that functions to lower reluctance, e.g., ferrite loaded epoxy, etc. The ferromagnetic core may be formed in the aperture by a molding process.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. In the figures like reference characters refer to like components, parts, elements, or steps/actions; however, similar components, parts, elements, and steps/actions may be referenced by different reference characters in different figures. It should be appreciated that the components and structures illustrated in the figures are not necessarily to scale, emphasis instead being placed upon illustrating the principals of the concepts described herein. Furthermore, embodiments are illustrated by way of example and not limitation in the figures, in which.

DETAILED DESCRIPTION

Figure 1A:
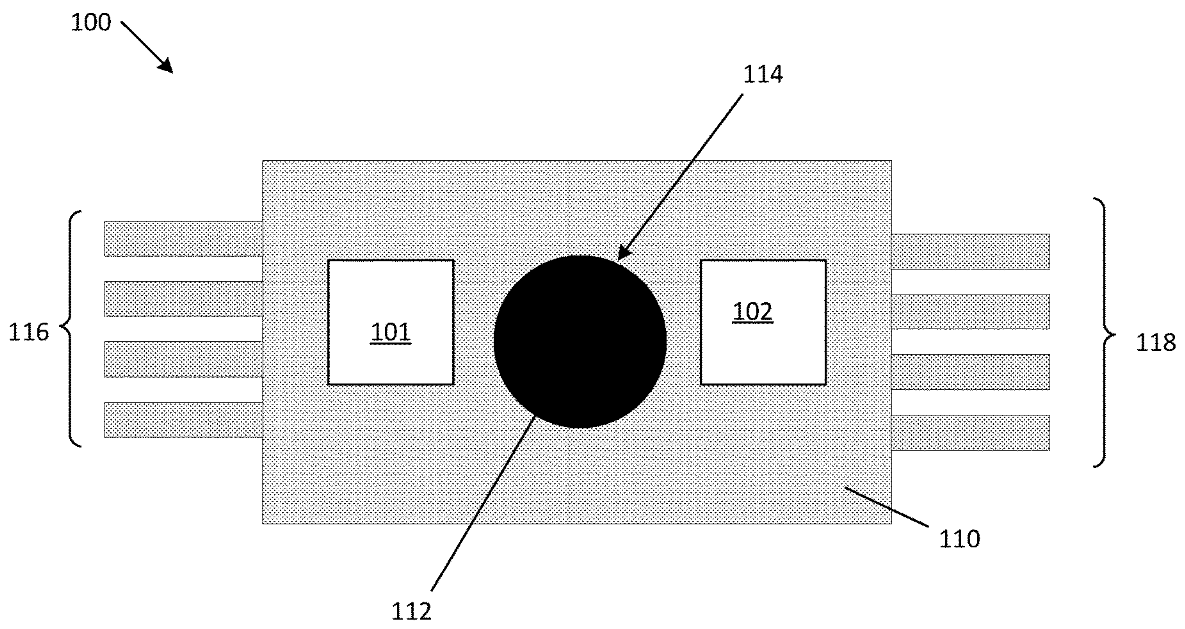
FIG. 1A is a top view showing an example integrated circuit package with a main body having a hole that allows an external transformer core to be inserted.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

Aspects of the present disclosure are directed to and include systems, structures, circuits, and methods providing integrated circuit (IC) packages or modules having a transformer (transformer windings) initially fabricated without a ferromagnetic core. When the IC package (a.k.a., module) is molded, a hole or aperture may be formed so a ferromagnetic core may be placed and received in the aperture at a later time, e.g., such as for later fabrication and/or testing. The ferromagnetic core may be a soft ferromagnetic core, e.g., ferrite, soft ferromagnetic metal core, a laminated soft ferromagnetic metal core, or a molded soft ferromagnetic core. In some examples, an insulating coating may be placed on the package to increase the isolation capability of the final package. The IC packages and modules may include various types of circuits; in some examples, IC packages or modules may include a galvanically isolated gate driver or other high voltage circuit, etc.

Cores may be made from or include any suitable soft ferromagnetic material. These materials may include, but are not limited to, metal alloys such as NiFe, SiFe, or other soft ferromagnetic metal alloys, or soft ferromagnetic ferrite materials. Ferrite materials are ceramic materials that typically include iron oxides and one or more metal oxides. Suitable soft ferrite materials may include iron oxide(s) added with suitable metal oxides and may include accompanying additives (compounds and/or elements). Suitable soft ferrite materials can include, but are not limited to, Ni—Zn (e.g., with the formula $Ni_aZn_{(1-a)}Fe_2O_4$), Mn—Zn (e.g., with the formula $Mn_{1-a}Zn_aFe_2O_4$), and the like; other suitable soft ferrite materials may be used within the scope of the present disclosure. Suitable additives may be added to a soft ferrite material and used within the scope of the present disclosure. Suitable additives can include, but are not limited to, $SiO_2$, CaO, $V_2O_5$, $Bi_2O_3$, $MoO_3$, $Nb_2O_5$ and/or $TiO_2$. In some embodiments, a core may include laminations of soft ferromagnetic materials.

The core may be placed in and received by the aperture, e.g., after the package body is formed, and may have a mechanical feature such as a flange or ring to prevent the core from falling out of the package. Some examples and embodiments may use molded (moldable) ferromagnetic material to fill the hole/aperture in the package, e.g., with a second (or additional stage) mold process after the initial bodying molding process. In some examples/embodiments, a moldable soft ferromagnetic material may include soft ferromagnetic particles (e.g., including ferrite particles) and a suitable epoxy mold compound binder. In other embodiments, a polymer binder may be used with ferrite particles to provide a core. The transformer windings may be composed of or include conductive traces or windings on an internal circuit board with one or more holes (apertures) to allow the core to pass through the windings of the board/lead frame. In some embodiments, the windings may be composed of or include a combination of preformed metal parts, e.g., lead frame(s), held by suitable insulation/dielectric material, for example, molding and/or potting compound.

One or more (e.g., first and second) semiconductor dies (dice) can be included in a package in accordance with the present disclosure. Such die(s) can include one or more integrated circuits (ICs). In some embodiments, such ICs may include, but are limited to, one or more high-voltage circuits such as galvanically-isolated gate drivers configured to drive, e.g., a gate on an external solid-state switch, another type of power switching device, or another load. In various embodiments, examples of solid-state switches that can be driven by (gate driver) packages in accordance with the present disclosure can include, but are not limited to, field-effect transistors (FETs) such as MOSFETs, GaN (gallium nitride) FETs, and SiC (silicon carbide) FETs, and insulated-gate bipolar transistors (IGBTs), and the like.

In some examples, a lead frame or circuit board may have additional polymer or insulation layers, e.g., to comply with given isolation requirements. In some examples, a printed circuit board (PCB) may be replaced with a substrate, e.g., an alumina substrate. In examples, primary and secondary (a.k.a., first and second sides) of the transformer windings may be on opposite sides of the PCB or alumina substrate to increase the voltage isolation. In some examples, wire bonds may be used to connect the windings to the die. In some examples, a die may be flip chip connected to a circuit board, e.g., alumina or PCB, or flex substrates such as polyimide or other non-conductive polymer material. The die or the winding substrates may then be connected to the pins of the package by wire bonding or another suitable method. In some examples, solder bumps or stud bump processes can be used. If the dies are also connected to the board using a similar method, it may be preferable that the solder or bump materials are selected such that the reflow process used to connect the winding substrate with the dies to the leads does not cause the dies to fall off of the substrate.

In some examples, a final package or module can be coated with an insulator, or a tape material could be added to the module or package to hold the core in place. A second (or third if the core is molded) mold of insulating material can also be used to secure the core and provide increase distance between first and second sides of the IC in the package, e.g., high and low sides of the package. If a second or third mold is used, locking features may be made in the first mold to help secure the second mold (or third mold).

FIG. 1A is a top view showing an example integrated circuit (IC) package 100 with a main body 110, e.g., main plastic body (molded package body), having a hole (aperture) 112 that allows a core (e.g., an external transformer core) 114 to be inserted, in accordance with the present disclosure. Core 114 may be a ferromagnetic core and may include any suitable soft ferromagnetic core material. First and second semiconductor dies 101, 102, and first and second sets of leads 116 and 118 (lead sets) are shown. The presence of the hole (aperture) 112 can allow the package 100 to undergo fabrication and/or testing before committing the core 114 to the package 100.

In some examples, core 114 may include a high magnetic permeability material, such as a soft ferromagnetic material, e.g., ferrite, permalloy, or another NiFe alloy, or silicon iron (e.g., SiFe with approximately 3% silicon). A nominal frequency or frequency range of operation may be considered for selection of optimal material for core 114, as a soft ferromagnetic metal core will generally have larger eddy currents and lower performance at higher frequencies when compared to a soft ferromagnetic ferrite core. In order to increase the frequency range of operation for a soft ferromagnetic core, a laminated or layered core structure may be used such that the laminations reduce the eddy current effects in the soft ferromagnetic metal core. In one embodiment, the laminations may be approximately (e.g., within +/−20 degrees) perpendicular to the magnetic flux direction.

As shown, IC package 100 can include first and second semiconductor dies 101, 102, which may include integrated circuits (ICs), e.g., data and/or power transmission and/or reception circuits for sending data and/or power across (traversing) a magnetic isolation gap (galvanic isolation) provided by coils and core 114. In some examples, the IC package or module 100 may include or house, e.g., an isolated gate driver, or other high voltage application/IC. In some examples, first semiconductor die 101 and/or second semiconductor die 102 can include a microcontroller (controller) and/or an application-specific IC (ASIC). First and second semiconductor dies (a.k.a., IC dies) 101, 102 may be received by or supported on a substrate (not shown), which may include but is not limited to, a PCB, a lead frame, a ceramic substrate, e.g., high-temperature co-fired ceramic (HTCC) or low-temperature co-fired ceramic (LTCC), an alumina substrate, or the like.

Figure 1B:
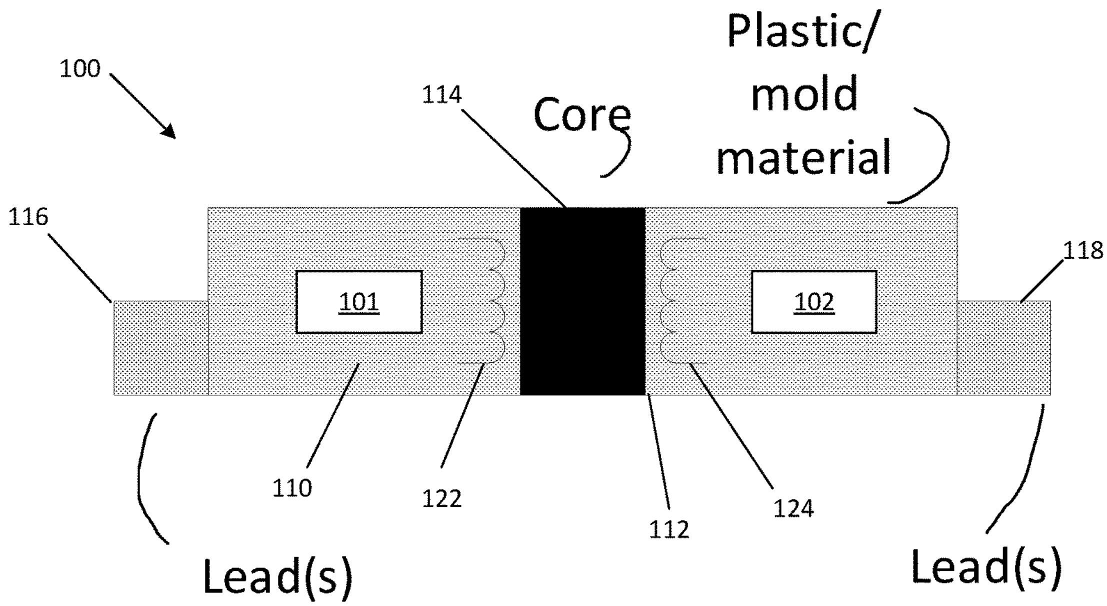
FIG. 1B is a side view of the package of FIG. 1A.

FIG. 1B is a side view of the package 100 shown in FIG. 1A. Main body 110 can include an aperture or hole 112 configured to receive core 114. Leads (lead sets) 116 and 118 are shown at sides of main body 110 for electrical connection to one or more integrated circuits (ICs), e.g., of dies 101 and 102, within main body 110. Two coils 122 and 124 are shown within main body 110 and may be connected to first and second dies 101, 102, respectively. While two coils 112 and 124 are shown, a different number of coils may be implemented (e.g., three, four, etc., or even one). While coils 122 and 124 are indicated on respective sides of aperture 112, it will be understood that coils 122 and 124 may each include or form one (or more) loops of conductor that are, e.g., stacked vertically in the main body 110 at different locations along a length/dimension (e.g., longitudinal axis) of the core 114.

In some examples or embodiments, the first and second dies 101, 102 (e.g., primary side and secondary side circuits) in the main body 110 can be fabricated or configured to have a desired minimum separation distance (e.g., to meet internal creepage or clearance requirements for a given pollution degree) between closest (voltage) points of the respective circuits, e.g., the low (primary) side and high (secondary) side. For example, the distance between any two voltage points between the primary and secondary sides, e.g., between die 101 and die 102 in FIG. 1, may be at least 1.2 mm, 1.4 mm, 1.5 mm, 3.0 mm, 4.0 mm, 5.5 mm, 8.0 mm, 10 mm, or 10+mm, in respective examples. Such a distance between conductive portions of dies can include any insulation covering a conductor, e.g., such as plastic coating of a wire/lead.

A dielectric material (e.g., gel) may be used for potting and/or protecting PCB system assemblies, e.g., power semiconductor packages or modules such as 100, to protect dies and/or interconnects from environment conditions and/or to provide dielectric insulation. In some examples, a dielectric material may include, but is not limited to, one or more of the following materials: DOWSIL™ EG-3810 Dielectric Gel (made available by The Dow Chemical Corporation, a.k.a., "Dow", and DOWSIL™ EG-3896 Dielectric Gel (made available by Dow), which has the ability to provide isolation greater than 20 kV/mm. Other suitable gel materials may also or instead be used, e.g., to meet or facilitate meeting/achieving voltage isolation specifications required by a given package design. DOWSIL™ EG-3810 is designed for temperature ranges from −60° C. to 200° C. and DOWSIL™ EG-3896 Dielectric Gel −40° C. to +185° C.; both of which can be used to meet typical temperature ranges for automotive applications.

Figure 2A:
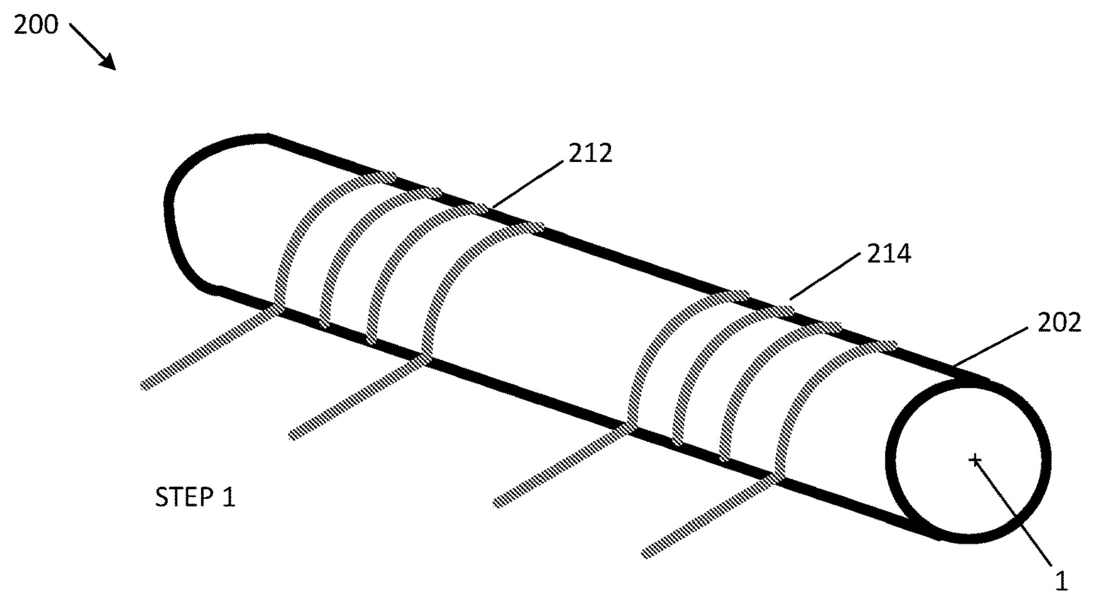
FIG. 2A is a perspective view showing an example of a step of configuring transformer windings for a fabrication process for an IC package with a core, in accordance with the present disclosure.

FIG. 2A is a perspective view showing an example of a step of configuring transformer windings (coils) for a fabrication process 200 for an IC package with a core, in accordance with the present disclosure. As a step (shown as STEP 1) in process 200, transformer windings (coils) 212, 214 can be wound or pre-wound on or around insulating material, e.g., a length of round insulating material 202. A cylinder of insulating material 202 is shown with first and second coils 212, 214 disposed at different locations along a longitudinal axis 1 of cylinder 202. Pre-winding coils can be performed with minimal tooling cost for high volume manufacturing. Wire can be coated with an insulator, e.g., similar to magnetic motor wire, if necessary for double insulation. A suitable length of insulating material (round stock) can be built with many windings on it. While coils 212 and 214 are shown as having a certain number of coil loops, coils 212, 214 may have a different number of coil loops, including fractional numbers, and each coil may have a different number of coil loops with respect to the other coil(s). While insulating material 202 is shown having a round cross section, the insulating material 202 may of course have other shapes within the scope of the present disclosure.

Figure 2B:
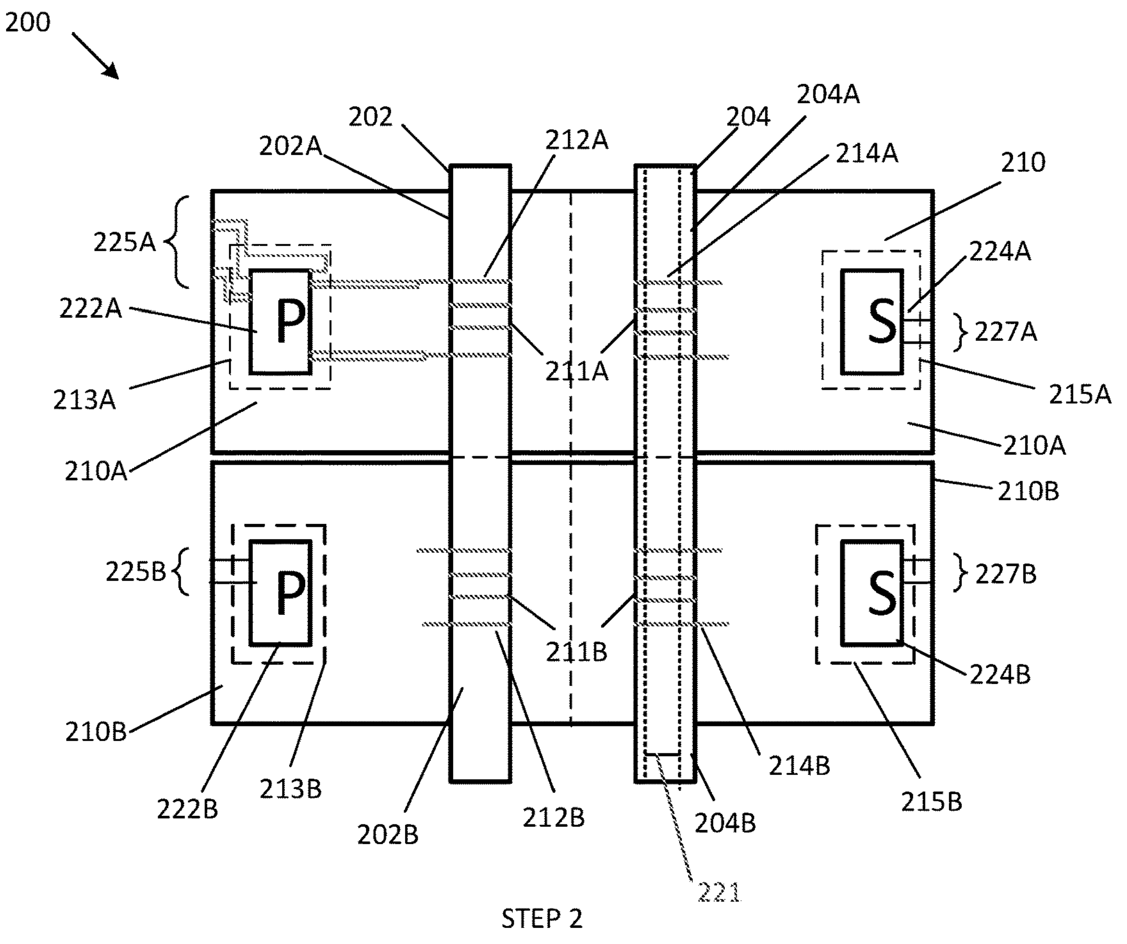
FIG. 2B is a diagram showing an example step of substrate, e.g., lead frame, population of the fabrication process.

FIG. 2B is a diagram showing an example step of substrate, e.g., lead frame, population (shown as STEP 2) of fabrication process 200, in accordance with the present disclosure. A substrate, e.g., lead frame body, 210 is shown populated with primary dies (dies with ICs for primary sides of transformers) 222A-B, secondary dies (dies with ICs for secondary sides of respective transformers) 224A-B, two insulator bodies 202, 204, and two "preformed" sets of winding (windings sets) 211A-B configured (wound) about insulator bodies 202, 204. Winding sets 211A-B can include primary windings 212A-B and secondary windings 214A-B, as indicated. Substrate, e.g., lead frame body, 210 may include multiple parts, e.g., lead frames 210A-B, which may each include a substrate (e.g., lead frame) configured with first and second die-receiving areas/structures, e.g., semiconductor die pads 213A-B and 215A-B. While substrate 210 can be or include a lead frame in some embodiments, substrate 210 is not limited to a lead frame and may include other structure(s) in other examples or embodiments, e.g., PCB, alumina, ceramic, glass substrate, flexible (e.g., polyimide) substrates, etc. First and second die pads 213A-B and 215A-B can be configured to hold first and second semiconductor dies, e.g., shown as primary and secondary dies 222A-B and 224A-B. Primary and secondary dies 222A-B and 224A-B may, in some examples, include galvanically-isolated circuits configured for magnetic coupling, e.g., high-voltage gate drivers or the like. Each die can have a set of leads for connection to other components and/or circuits, e.g., as indicated by lead sets 225A-B for primary dies 222A-B and lead sets 227A-B for secondary dies 224A-B. In other embodiments, other numbers of leads are possible for the package on the primary side to connects the primary die to one or more systems/circuits/components outside of the package, and/or on the secondary side to connect the secondary die to one or more systems/circuits/components outside of the package.

Each set of windings, e.g., 211A, can include a first winding 212A on a first stock (e.g., cylinder) 202 of insulating material and a second winding 214A on second stock 204 of insulating material. For the step/configuration shown, the entire panel may be subject to a reflow process of a suitable length of time, e.g., depending on dimensions of the primary body and/or the materials in solder used. In examples, a primary die (e.g., 222A may include a low voltage circuit and a related secondary die (e.g., 224A) may include a high-voltage circuit, e.g., a gate driver, etc. In some examples, insulator bodies 202, 204 may have a bore (aperture) 221 to provide a passageway for a core. In some examples, insulator bodies 202, 204 may be removed prior to replacement by a core. In some embodiments, insulator bodies 202, 204 may be hollow (as indicated by bore 221) to allow insulator bodies 202, 204 to remain in the final package and provide an insulation layer between the coils and a soft ferromagnetic core (e.g., core 230 shown in FIG. 2D).

Figure 2C:
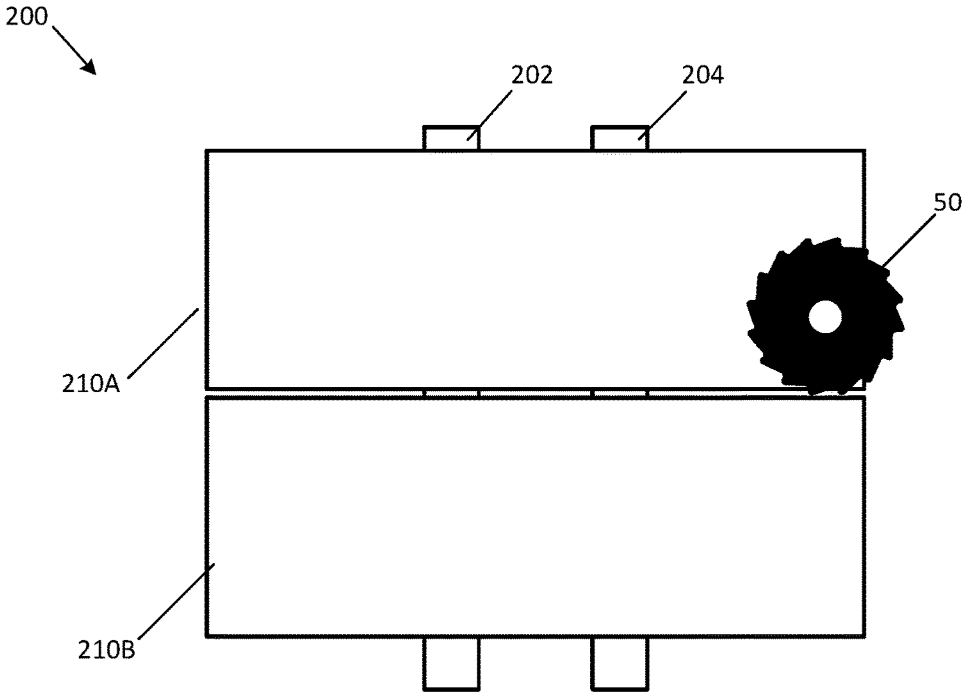
FIG. 2C is a diagram showing an example molding and singulation for preparation of core insertion as part of the fabrication process.

FIG. 2C is a diagram showing an example molding and singulation step (shown as STEP 3) for preparation of core insertion as part of fabrication process 200, in accordance with the present disclosure. As indicated, a panel, having dies and lead frames for multiple packages/modules, can be molded. Parts can then be separated (singulated), e.g., diced, sawed, etc., into separate IC module or package bodies 210A, 210B. Representative saw 50 is shown for singulation. In other examples, a laser cutting technique may be used to separate the package bodies.

Figure 2D:
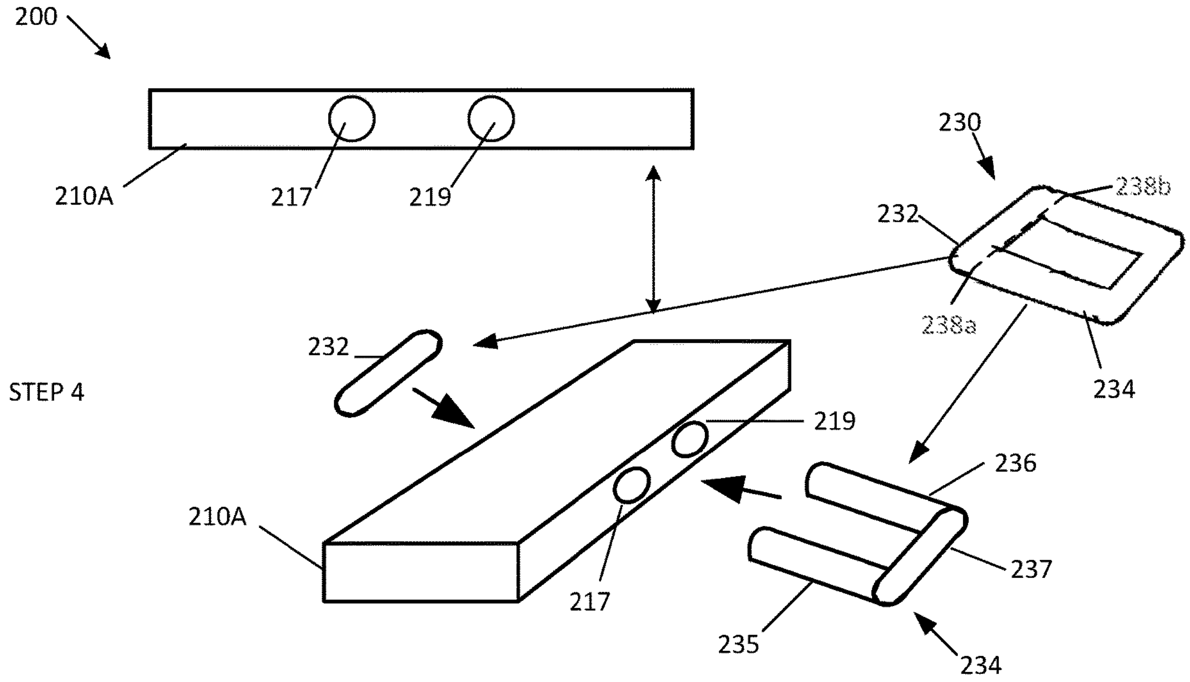
FIG. 2D is a diagram showing an example core insertion step of the fabrication process; and, FIG. 2E shows side-sectional views of alternate configurations of connections between core pieces facilitating lower reluctance of a core when the pieces are joined together.
Figure 2E:
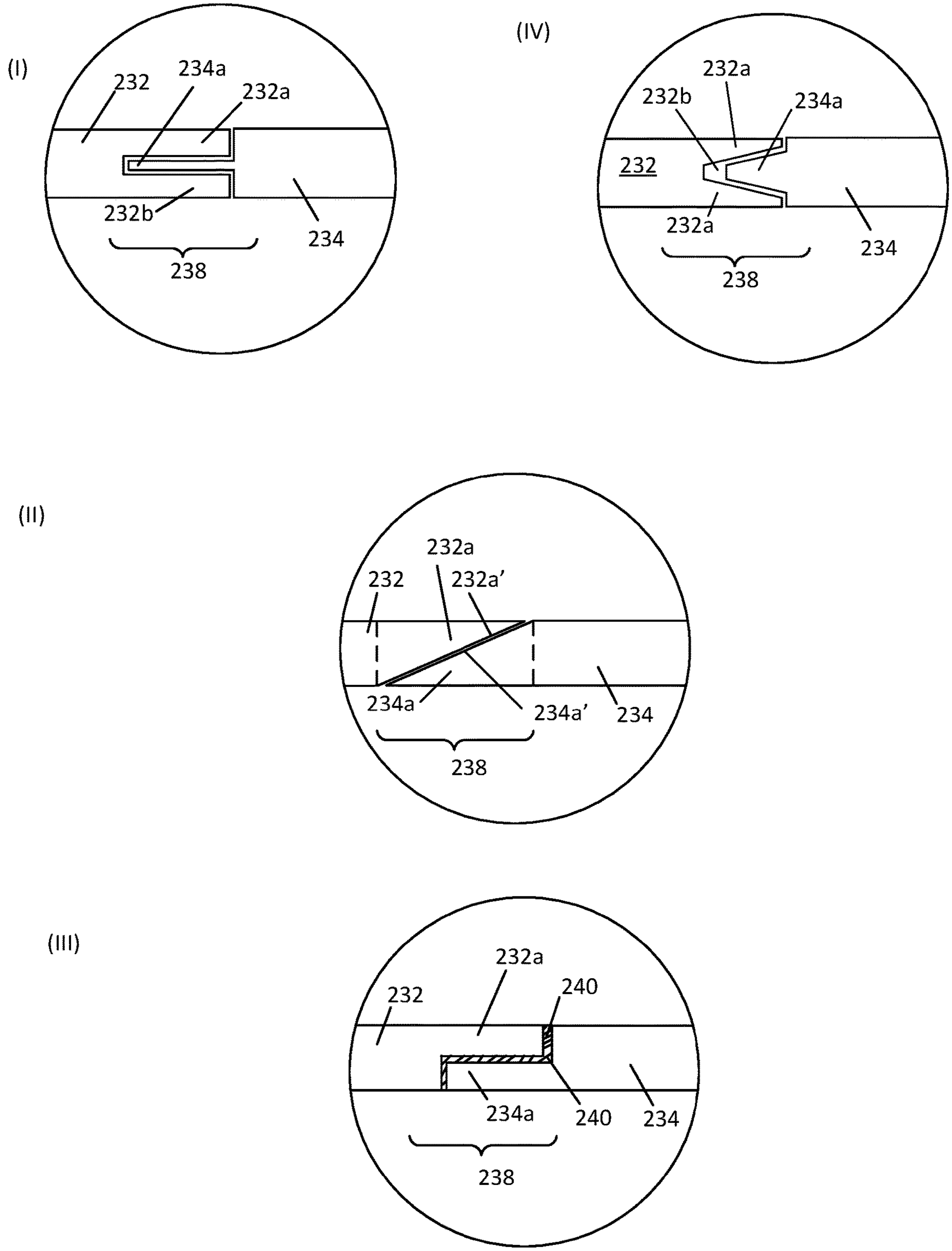

FIG. 2D is a diagram showing an example of a core insertion step (shown as STEP 4) of fabrication process 200, in accordance with the present disclosure. Three different views are shown. The one at top left is a side view of the IC package body 210A (after having been separated from IC package body 210B shown in FIG. 2C). The lower view is a perspective view of IC package body 210A with separate pieces 232 and 234 of the transformer core 230. The middle-right view shows how the core parts/pieces 232 and 234 fit together when joined as the core 230. U-shaped part 234 is shown as having two legs 235, 236 joined by part 237. First and second core pieces 232 and 234 are shown joined or connected at joints 238*a*, 238*b*; alternate joint configurations are shown in FIG. 2E. Core 230 may have any suitable shape. In some embodiments, core 230 may form a closed shape. In some embodiments, a core part (e.g., 234) may have a shape other than a "U-shape", e.g., an "E-shape," "C-shape," etc.

By way of singulation (e.g., including a cutting process such as indicated by saw blade 1 in FIG. 2C), winding "spools" 217, 219 are exposed on sides. The winding spools 217, 219 may be sectioned or cut from insulator bodies (e.g., dowels) 202, 204 (FIG. 2C). One or more portions of core 230, e.g., suitable "U" ferrite core parts (shown as legs 235, 236 of U-shaped core part 234), can be inserted on the side of package body 210A—with the apertures provided by winding spools 217, 219 (for the case where insulator bodies 202, 204 include interior apertures) or by the removal of the winding spools—and affixed (e.g., glued) in place. In some examples/embodiments, a ferrite loaded epoxy may be used to lower reluctance at the joint or connection of the ferrite core parts 232, 234. The core 230 may be mounted with or bonded to other parts/structure of a package by a bonding material that functions to lower reluctance, e.g., ferrite loaded epoxy, etc. A ferrite loaded epoxy may be used to connect the core 230 to the aperture, thus reducing reluctance when compared to a non-ferrite loaded epoxy. In some examples/embodiments, core 230 can optionally be removable from package body 210A.

FIG. 2E shows side-sectional views of alternate configurations (I)-(IV) of connections between core pieces 232, 234 facilitating lower reluctance of a core when the core pieces/parts are joined together. As shown in configurations (I)-(IV), core pieces 232 and 234 can have geometries that fit together (mate) at a joint 238, for example at joints 238*a*, 238*b* in FIG. 2D. For the connections, e.g., joints, where the core (e.g., ferrite) pieces come together, the separate core pieces 232, 234 may be formed to overlap. By increasing the surface area of the joint (relative to the surface area of the cross section of a core piece) between the pieces 232, 234, the reluctance—and corresponding losses—across the joint 238 between the pieces can be advantageously decreased. Core pieces 232, 234 may have any suitable cross section, including, but not limited to, elliptical, circular (as shown in FIG. 2D), rectangular, square, C-beam, I-beam, H-beam, etc.

Configuration (I) shows core piece 232 as having two extending members 232*a*, 232*b* configured to receive extending member 234*a* of core piece 234 at joint 238. The extending members 232*a*, 232*b*, and 234*a* may be interdigitated (e.g., as shown); in alternate embodiments extending members may have circular cross sections, with one extending member having a smaller radius cylinder configured to fit inside of a larger radius cylinder present for the other extending member. In some embodiments, e.g., in which the extending members have a more rectangular or square cross-sections, the extending members may be configured in a mortise and tenon like structure.

Configuration (II) shows core pieces 232, 234 each having an extending member 232*a*, 234*a*, with an angled face 232*a*', 234*a*', respectively, and configured to fit together at joint 238. Configuration (III) shows core pieces 232, 234 each having an extending member 232*a*, 234*a*, respectively, and configured to fit together at joint 238. As shown for configuration (III), joint 238 may include bonding material, e.g., ferrite loaded epoxy, that can serve to reduce reluctance and corresponding losses across the joint (boundary) between the core pieces 232, 234.

As shown in configuration (IV) of FIG. 2E, in some embodiments, core pieces 232, 234 may have a circular cross-section. Joint 238 may include an angled face (surface) of one core piece 234 presenting an extending member 234*a* having a conical shape, which is received by a complementary (mating) conical aperture in the other core piece 232 formed by extending member 232*a*. Such a conical joint configuration may facilitate ready/easy alignment (self-guiding) of the core pieces 232, 234 when being joined at joint 238. Surfaces of pieces 232, 234 in or near joint 238 are not necessarily flat/angular and may include curved or shaped surfaces having multiple vertices and/or planar/curved segments or portions.

Figure 3:
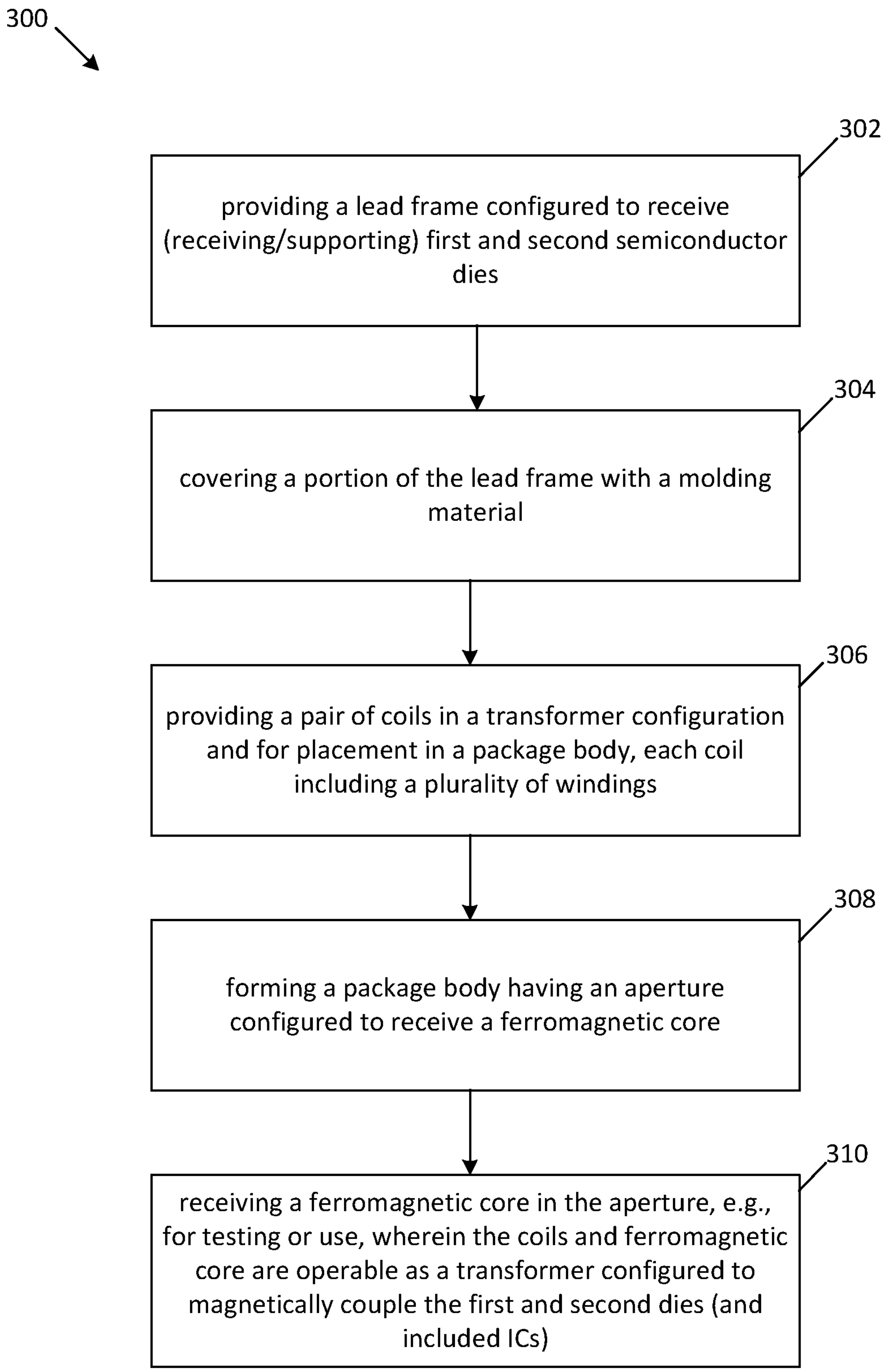
FIG. 3 is a diagram showing a method of fabricating an IC package configured to receive a core, in accordance with the present disclosure.

FIG. 3 is a diagram showing a method (process) 300 of fabricating an IC package configured to receive a core, in accordance with the present disclosure. Method 300 can include providing a lead frame (or other substrate, e.g., PCB, etc.) configured to receive (receiving or supporting) first and second semiconductor dies, as described at 302. For example, a single lead frame with two (or more) die pads may be provided for step 302 (or a similar step) of method 300. Method 300 can include covering a portion of the lead frame with a molding material, as described at 304. Any suitable molding material may be used, including a molding compound, such as an epoxy mold compound, and/or potting material; these may include, but are not limited to, organic resins such as epoxy resin, fillers including inorganic materials such as silica, catalysts to accelerate the cure reaction, mold release materials, and pigments or colorants; other materials, such as flame retardants, adhesion promoters, ion traps, and/or stress relievers may also be added to/included in the mold compound.

Method 300 can include providing/placing a pair of coils in a transformer configuration, e.g., pre-configured (pre-wound) about a dowel or dowels, and for placement in a package body around one or more aperture regions, each coil including a plurality of windings, as described at 306. The aperture region may be a region where an aperture is later formed. Method 300 can include forming a molded package body having an aperture configured to receive a ferromagnetic core, as described at 308. Method 300 can include receiving a soft ferromagnetic core in the aperture, e.g., for testing suitable functionality of the IC circuit(s) and/or transformer, wherein the coils and ferromagnetic core are operable as a transformer configured to magnetically couple the first and second semiconductor dies (and included respective ICs), as described at 310. In some examples/embodiments, the core can be removable and method 300 can optionally include removing the core from the package body, e.g., after one or more molding steps resulting in formation of the package body.

In an alternative embodiment, method 300 can include the die(s) being placed on the lead frame (similar to as described for step 302, above), followed by placing a pair of transformer coils (similar to as described for step 306, above) and then over molding the die, a portion of the lead frame, and the parts of coils with molding material (similar to as described for step 304, above), while leaving an aperture to receive a soft ferromagnetic core (similar to as described for step 308, above). This approach can advantageously utilize only a single molding step.

Accordingly, embodiments of the inventive subject matter can afford various benefits relative to prior art techniques. Embodiments and examples of the present disclosure can enable or facilitate avoidance or mitigation of magnetostriction for IC packages/modules. Embodiments and examples can provide for high scalability, e.g., by allowing for easily changed width of IC packages while maintaining length and thickness. Embodiments and examples can allow for relaxing or removing any need to maintain tight planarity dimensions in applying a core to an IC module or IC package. Embodiments and examples according to the present disclosure can allow/provide for the core material to be added after other packaging is completed and tested thus lowering fabrication/testing costs, as the core may be a significant cost driver in a final materials list for a given IC package.

Various embodiments of the concepts, systems, devices, structures, and techniques sought to be protected are described above with reference to the related drawings. Alternative embodiments can be devised without departing from the scope of the concepts, systems, devices, structures, and techniques described. For example, while some examples are described herein as having transformer cores aligned in a direction parallel to the substrate direction (die surface), other examples and embodiments may have a core aligned parallel to the epitaxial direction (i.e., normal to the substrate direction). For further example, while embodiments and examples are described herein as generally including two transformer windings, examples and embodiments of the present disclosure may include a different number of transformer windings, including, but not limited to: one, two, three, four, five, . . . , 20, 30+, etc.; moreover, the windings (coils) themselves may each have a whole number or fractional number of turns (loops about a related core or structure intended to receive a core), e.g., 1.5, 2.5, 1.75, 1.8, 2.25, etc.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e., one, two, three, four, etc. The term "plurality" indicates any integer number greater than one. The term "connection" can include an indirect "connection" and a direct "connection".

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target (or nominal) value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. A galvanically-isolated integrated circuit package comprising:

a lead frame configured to receive first and second semiconductor dies;

a molding material configured to cover a portion of the lead frame and form a package body and having an aperture configured to receive a soft ferromagnetic core;

first and second coils in a transformer configuration and disposed in the package body, each including a plurality of windings disposed about the aperture;

wherein, when the soft ferromagnetic core is received in the aperture, the first and second coils and soft ferromagnetic core are operable as a transformer configured to magnetically couple the first and second semiconductor dies; and a soft ferromagnetic core received by the aperture of the package body, wherein the soft ferromagnetic core comprises first and second core pieces forming a closed shape, wherein the soft ferromagnetic core comprises first and second core pieces configured for connection at a plurality of joints, wherein a joint of the plurality of joints comprises at least one extending member of the first soft ferromagnetic core piece received by at least one extending member of the second soft ferromagnetic core piece, and wherein the joint further comprises ferrite loaded epoxy disposed between portions of the first and second soft ferromagnetic core pieces.

2. The galvanically-isolated integrated circuit package of claim 1, further comprising first and second die pads configured to receive the first and second semiconductor dies, respectively.

3. The galvanically-isolated integrated circuit package of claim 2, wherein the first and/or second semiconductor dies comprise at least one integrated circuit.

4. The galvanically-isolated integrated circuit package of claim 3, where the at least one integrated circuit comprises a gate driver circuit.

5. The galvanically-isolated integrated circuit package of claim 3, wherein the at least one integrated circuit comprises a controller.

6. The galvanically-isolated integrated circuit package of claim 1, wherein the soft ferromagnetic core comprises a ferrite core.

7. The galvanically-isolated integrated circuit package of claim 1, wherein the soft ferromagnetic core comprises SiFe.

8. The galvanically-isolated integrated circuit package of claim 7, wherein the soft ferromagnetic core comprises a plurality of laminated layers.

9. The galvanically-isolated integrated circuit package of claim 1, wherein the aperture comprises first and second apertures, and wherein the first and second coils are configured around the first and second apertures, respectively.

10. The galvanically-isolated integrated circuit package of claim 1, wherein the aperture comprises an insulator having a bore from a first side of the package body to a second side of the package body, wherein the bore is configured to receive the soft ferromagnetic core.

11. A galvanically-isolated integrated circuit package comprising:

first and second die pads;

first and second semiconductor dies coupled to the first and second die pads, respectively;

a molding material forming a package body and configured to cover the first and second semiconductor dies, wherein the package body includes an aperture configured to receive a soft ferromagnetic core;

first and second coils disposed in the package body, each including a plurality of windings disposed about the aperture;

wherein, when the soft ferromagnetic core is received in the aperture, the first and second coils and soft ferromagnetic core are operable as a transformer configured to magnetically couple the first and second semiconductor dies; and a soft ferromagnetic core disposed in the aperture, wherein the soft ferromagnetic core includes first and second core parts, each having an extending member configured to reduce reluctance at a joint between the core parts.

12. The galvanically-isolated integrated circuit package of claim 11, wherein the first and/or second semiconductor dies comprise an integrated circuit.

13. The galvanically-isolated integrated circuit package of claim 12, where the integrated circuit comprises a gate driver circuit.

14. The galvanically-isolated integrated circuit package of claim 12, wherein the integrated circuit comprises a controller.

15. The galvanically-isolated integrated circuit package of claim 11, wherein the soft ferromagnetic core comprises a ferrite core.

16. The galvanically-isolated integrated circuit package of claim 11, wherein the soft ferromagnetic core comprises SiFe.

17. The galvanically-isolated integrated circuit package of claim 16, wherein the soft ferromagnetic core comprises a plurality of laminated layers of SiFe.

18. The galvanically-isolated integrated circuit package of claim 11, further comprising first and second substrate portions, wherein the first and second die pads comprise the first and second substrate portions.

19. The galvanically-isolated integrated circuit package of claim 11, wherein the aperture comprises an insulator having a bore from a first side of the package body to a second side of the package body, wherein the bore is configured to receive the soft ferromagnetic core.

20. The galvanically-isolated integrated circuit package of claim 11, wherein the aperture comprises two apertures.

* * * * *